(12) United States Patent
Mowry et al.

(10) Patent No.: US 8,093,634 B2
(45) Date of Patent: Jan. 10, 2012

(54) IN SITU FORMED DRAIN AND SOURCE REGIONS IN A SILICON/GERMANIUM CONTAINING TRANSISTOR DEVICE

(75) Inventors: Anthony Mowry, Buda, TX (US); Andy Wei, Dresden (DE); Andreas Gehring, Dresden (DE); Casey Scott, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 275 days.

(21) Appl. No.: 12/394,475

(22) Filed: Feb. 27, 2009

(65) Prior Publication Data
US 2009/0294860 A1 Dec. 3, 2009

(30) Foreign Application Priority Data

May 30, 2008 (DE) .......................... 10 2008 026 189
Sep. 15, 2008 (DE) .......................... 10 2008 047 127

(51) Int. Cl.
*H01L 25/07* (2006.01)
*H01L 21/363* (2006.01)
*H01L 21/336* (2006.01)

(52) U.S. Cl. ................ 257/288; 257/368; 257/E25.016; 257/E21.409; 257/E21.462; 438/491; 438/301

(58) Field of Classification Search .................. 257/288, 257/368
See application file for complete search history.

(56) References Cited

U.S. PATENT DOCUMENTS

| | | | | |
|---|---|---|---|---|
| 2003/0052721 A1* | 3/2003 | Chaudhry et al. | ............ | 327/242 |
| 2003/0119237 A1* | 6/2003 | Chittipeddi et al. | .......... | 438/199 |
| 2006/0076627 A1 | 4/2006 | Chen et al. | .................... | 257/369 |
| 2008/0067545 A1* | 3/2008 | Rhee et al. | .................... | 257/190 |
| 2009/0001413 A1* | 1/2009 | Gauthier et al. | ............. | 257/190 |
| 2009/0004806 A1* | 1/2009 | Siprak | ........................... | 438/306 |

OTHER PUBLICATIONS

Translation of Official Communication from German Patent Office for German Patent Application No. 10 2008 047 127.5-33 dated Jul. 8, 2009.

* cited by examiner

*Primary Examiner* — Jarrett Stark
*Assistant Examiner* — Lawrence Tynes, Jr.
(74) *Attorney, Agent, or Firm* — Williams, Morgan & Amerson, P.C.

(57) ABSTRACT

By repeatedly applying a process sequence comprising an etch process and a selective epitaxial growth process during the formation of drain and source areas in a transistor device, highly complex dopant profiles may be generated on the basis of in situ doping. Further-more, a strain material may be provided while stress relaxation mechanisms may be reduced due to the absence of any implantation processes.

5 Claims, 11 Drawing Sheets

IN SITU FORMED DRAIN AND SOURCE REGIONS IN A SILICON/GERMANIUM CONTAINING TRANSISTOR DEVICE

BACKGROUND

1. Field of the Disclosure

Generally, the present disclosure relates to integrated circuits, and, more particularly, to transistors having complex dopant profiles and including a silicon/germanium alloy for creating strain in the channel region.

2. Description of the Related Art

Integrated circuits comprise a large number of circuit elements on a given chip area according to a specified circuit layout, wherein transistors, such as field effect transistors, represent an important component that is used as switching element, current and/or voltage amplifier. The transistors are formed in and above substantially crystalline semiconductor regions with additional dopant materials that are formed at specified substrate locations to act as "active" regions, that is, to act, at least temporarily, as conductive areas for creating a controlled current flow. Generally, a plurality of process technologies are currently practiced, wherein, for complex circuitry, such as microprocessors, storage chips and the like, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A transistor, irrespective of whether an N-channel transistor or a P-channel transistor or any other transistor architecture is considered, comprises so-called PN junctions that are formed by an interface of highly doped regions, such as drain and source regions, with a lightly doped or non-doped region, such as a channel region, disposed adjacent to the highly doped regions.

In the case of a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of the MOS transistors. Thus, the scaling of the channel length, and associated therewith the reduction of channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the dimensions of transistors. For example, highly sophisticated dopant profiles, in the vertical direction as well as in the lateral direction, are required in the drain and source regions to provide low sheet and contact resistivity, in combination with a desired channel controllability, in order to counter so-called short channel effects, such as drain-induced barrier lowering and the like. In addition, the vertical location of the PN junctions with respect to the gate insulation layer also represents a critical design criterion in view of leakage current control, as reducing the channel length also requires reducing the depth of the drain and source regions with respect to the interface formed by the gate insulation layer and the channel region, thereby calling for sophisticated implantation techniques.

Furthermore, since the continuous size reduction of the critical dimensions, e.g., the gate length of the transistors, necessitates the adaptation and possibly the new development of highly complex process techniques concerning the above-identified process steps, it has been proposed to also enhance device performance of the transistor elements by increasing the charge carrier mobility, for instance, in the channel region for a given channel length, thereby offering the potential for achieving a performance improvement that is comparable with the advance to a future technology node of down-sized devices while avoiding many of the above process adaptations associated with device scaling. In principle, at least two mechanisms may be used, in combination or separately, to increase the mobility of the charge carriers in the channel region. First, in field effect transistors, the dopant concentration within the channel region may be reduced, thereby reducing scattering events for the charge carriers and thus increasing the conductivity. However, reducing the dopant concentration in the channel region significantly affects the threshold voltage of the transistor device, thereby presently making a reduction of the dopant concentration a less attractive approach unless other mechanisms are developed to adjust a desired threshold voltage. Second, the lattice structure in respective semiconductor regions, such as the channel region, may be dilated/stretched, for instance, by creating tensile or compressive strain therein, which results in a modified mobility for electrons and holes, respectively. For example, creating uniaxial tensile strain in the channel region of a field effect transistor with respect to the current flow direction increases the mobility of electrons, which in turn may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor, which may enable the fabrication of fast powerful semiconductor devices without requiring expensive semiconductor materials and manufacturing techniques.

Consequently, it has been proposed to introduce a silicon/germanium alloy in the drain and source regions of P-channel transistors to create compressive stress that may result in a corresponding strain.

With reference to FIGS. 1a-1c, typical conventional approaches will be described for enhancing performance of P-channel transistors with respect to reducing short channel effects, enhancing charge carrier mobility in the channel region and reducing overall series resistance of the drain/source path.

FIG. 1a schematically illustrates a cross-sectional view of a P-channel transistor 100 including a substrate 101, such as a silicon bulk substrate and a silicon-on-insulator (SOI) substrate, i.e., a buried insulating layer (not shown) may be formed on the substrate 101. Furthermore, a semiconductor layer 102, such as a silicon layer, is formed above the substrate 101 and may include isolation structures 103, such as shallow trench isolations and the like. The isolation structures 103 may define an "active" region in and above which one or more transistor elements may be formed, such as the transistor 100. It should be appreciated that an active region is to be understood as a semiconductor region receiving or having formed therein appropriate dopant profiles so as to adjust the overall conductivity in accordance with device requirements, for instance for achieving transistor characteristics and the like. In the manufacturing stage shown, a gate electrode structure 104 may be formed above the semiconductor layer 102, wherein a gate insulation layer 104A of the gate electrode structure 104 separates a gate electrode material, such as polysilicon and the like, from a channel region 105 in the semiconductor layer 102. Moreover, as illustrated, the gate electrode structure 104 may have formed on sidewalls thereof a non-electrode material in the form of spacer elements 104B, such as silicon dioxide and the like. Furthermore, the gate electrode structure 104 is encapsulated by spacer elements 107 and a cap layer 108, which may, for instance, be comprised of silicon nitride. Furthermore, recesses or cavities 106 are formed in the semiconductor layer 102 laterally adjacent to and offset from the gate electrode structure 104, wherein a lateral offset is substantially determined by the width of the spacer 104B and the spacer 107.

A typical conventional process flow for forming the transistor 100 as shown in FIG. 1a may comprise the following processes. After forming the isolation structures 103, an appropriate vertical dopant profile within the semiconductor layer 102 may be defined by accordingly designed implantation processes. Thereafter, material layers for the gate electrode structure 104, i.e., a gate dielectric material and an electrode material, may be formed by appropriate techniques, such as thermal or wet chemical oxidation and/or deposition for the gate dielectric, while frequently low pressure chemical vapor deposition (LPCVD) may be used for depositing polysilicon as a gate electrode material. Moreover, further material layers, such as material for the cap layer 108, which may act as a portion of an anti-reflective coating (ARC), may also be deposited in accordance with well-established process recipes. The resulting layer stack may then be patterned by advanced photolithography and etch techniques, followed by the formation of the spacer 104B, for instance by thermal oxidation, deposition and the like. Next, a spacer material may be deposited, for instance in combination with a liner material, if required, which may then be patterned by well-established anisotropic etch techniques to obtain the spacer elements 107, the width of which may substantially determine the lateral offset of the cavities 106.

As previously explained, uniaxial compressive strain in the channel region 105 in the current flow direction may significantly enhance the mobility of holes, thereby enhancing overall performance of the transistor 100 when representing a P-channel transistor. In order to provide the desired compressive strain, the cavities 106 may be formed by well-established etch techniques using the spacers 107 and the cap layer 108 as an etch mask, wherein, in the example shown, the isolation structures 103 may also act as an etch mask. In other cases, an additional hard mask layer may be provided if the lateral extension of the cavities 106 is to be restricted so as to not entirely extend to the isolation structures 103. During the corresponding etch process, a certain amount of template material of the layer 102 may also be maintained if an SOI configuration is considered, in which a buried insulating layer may be positioned between the substrate 101 and the semiconductor layer 102. The cavities 106 may be refilled with an appropriate semiconductor material, such as silicon/germanium alloy, which has a natural lattice constant that is greater than the lattice constant of silicon, so that the corresponding epitaxially grown material may be formed in a strained state, thereby also exerting stress to the channel region 105 and thus creating a respective compressive strain therein. Selective epitaxial growth techniques for depositing silicon/germanium alloy materials are well established in the art and may be performed on the basis of appropriately selected process parameters, such as temperature, pressure, flow rate of precursor gases and carrier gases in such a manner that a significant deposition of material is substantially restricted to the crystalline silicon surfaces, while a deposition on dielectric materials may be suppressed. Moreover, during the deposition of the silicon/germanium material, a desired dopant species may also be incorporated into the deposition atmosphere, such as boron, in order to obtain a desired base doping for drain and source regions, depending on the required complexity of the vertical and lateral profile of the drain and source regions. Generally, a reduced series resistance of the drain and source regions may be achieved by providing high dopant concentrations, while, on the other hand, for highly scaled semiconductor devices, the corresponding electric field generated across the channel region 105 may result in increased charge carrier injection into the gate insulation layer 104A at high dopant concentrations, thereby typically requiring a reduced dopant concentration and a shallow profile of the drain and source regions in the vicinity of the gate electrode structure 104.

FIG. 1b schematically illustrates the transistor 100 in a further advanced manufacturing stage, in which the silicon/germanium alloy 109 may be formed in the cavities 106, as explained above, and wherein the spacers 107 and the cap layer 108 may be removed to expose the gate electrode structure 104. It should be appreciated that the spacers 104B may also be removed and may be replaced by appropriately designed offset spacers, if desired. As explained above, upon reducing the transistor dimensions, i.e., the gate length of the transistor 100, which is to be understood as the horizontal dimension of the gate electrode structure 104 in FIG. 1b, controllability of the channel region 105 may become increasingly difficult due to the short channel effects which, in some conventional approaches, may be countered in part by providing counter-doped regions 110, which may also be referred to as halo regions, in which the dopant concentration of the channel region 105 and the remaining semiconductor region, also referred to as the body region 102A, is significantly increased, thereby adjusting the inter gradient at corresponding PN junctions to be formed by providing shallow doped drain and source regions. Typically, the counter-doped regions or halo regions 110 may be formed by ion implantation, for instance using a tilt angle, in order to establish a certain degree of overlap with the gate electrode structure 104. However, upon further scaling the transistor dimensions, the dopant concentration and thus implantation dose may also have to be increased, thereby also increasing dopant-induced charge carrier scattering, dopant diffusion and, due to the high dose implantation processes involved, stress relaxation in the vicinity of the channel region 105. Furthermore, a dopant concentration in the drain and source regions is generally increased in order to obtain a reduced series resistance of the drain and source regions for not limiting device performance, also dose and energy for the implantation process for creating the halo regions 110 has to be increased. This in turn may further increase stress relaxation in the silicon/germanium alloy due to increased lattice damage and higher dopant diffusion. During the sophisticated implantation processes, longer treatment times may be required to obtain the desired high dose during the creation of the halo regions 110. Thus, although the silicon/germanium material 109 may be provided with high intrinsic dopant concentration, nevertheless, sophisticated and long implantation processes may be required for adjusting the PN junctions in the vicinity of the gate electrode structure 104 on the basis of the halo regions 110.

FIG. 1c schematically illustrates the transistor 100 according to further conventional approaches in an attempt to provide enhanced channel control and reduced dopant diffusion. As illustrated, the transistor 100 may comprise a spacer structure 111 including at least a first spacer element 111A and a second spacer element 111B, which may be separated by an etch stop liner (not shown), if required. Furthermore, the drain and source regions 112 may have a sophisticated profile in the lateral and vertical directions, wherein a very shallow portion 112A may connect to the channel region 105 and may have a concentration so as to provide enhanced channel control while avoiding an acceptable high electrical field strength in the vicinity of the gate electrode structure 104. Furthermore, an intermediate portion 112B is provided that has an increased dopant concentration due to the lateral offset to the channel region 105. Finally, a highly doped deeper drain and source portion 112C may be provided, in which an even increased dopant concentration may provide the required low resistance path in the drain and source regions 112. The sophisticated profile of the drain and source regions 112 as shown in FIG. 1c may be established by ion implantation processes in which the spacer structure 111 at the various manufacturing stages may be used as an implantation mask so as to adjust the lateral offset of the respective portions 112A, 112B, 112C to the channel region 105. Although this approach may provide enhanced channel controllability and a low resistance path in the drain and source regions 112, sophisticated implantation processes may be required wherein, however, in combination with the provision of a silicon/germanium alloy, significant lattice damage may be created, thereby contributing to a significant stress relaxation, which may be less desirable with respect to increasing charge carrier mobility in the channel region 105.

The present disclosure is directed to various methods that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

The present disclosure relates to methods and semiconductor devices in which complex vertical and lateral dopant profiles may be established in the drain and source regions by using in situ doping during a selective epitaxial growth sequence when providing a semiconductor alloy for enhancing the charge carrier mobility of a channel region. The sequence of epitaxial growth processes may, in some aspects, be associated with respective cavity etch processes to adjust the lateral offset and the depth of the dopant concentration introduced by the selective epitaxial growth processes. The incorporation of the dopant species may also involve the deposition of dopant species of opposite conductivity type, thereby enabling an efficient creation of counter-doped or halo regions without creating additional crystalline defects, such as dislocations, point defects, stacking faults and prismatic dislocation rings. Consequently, enhanced charge carrier mobility in the channel region of the transistor may be accomplished due to avoiding or at least significantly reducing stress relaxation mechanisms, while high dopant concentration for the counter-doped areas may also be provided, thereby suppressing undesired dopant diffusion, for instance, in P-channel transistors, which may suffer from increased diffusivity of P-type dopants, such as boron, while also enabling the adjustment of a steep dopant gradient, if desired. Furthermore, a desired high dopant concentration may be provided in deeper drain and source areas and areas with increased lateral offset to the channel region, thereby also establishing a low resistance path in the drain and source areas.

In other aspects, enhanced channel control may be accomplished by providing a semiconductor alloy of varying composition in combination with an appropriate in situ generated dopant profile.

One illustrative method disclosed herein comprises forming a first crystalline semiconductor material in a first recess that is located in an active region of a transistor laterally adjacent to a gate electrode structure by a first selective epitaxial growth process. A first crystalline semiconductor material comprises a dopant species of a first conductivity type and a dopant species of a second conductivity type that is opposite to the first conductivity type. The method further comprises forming a second recess laterally offset to the gate electrode structure, wherein the second recess extends through the first crystalline semiconductor material. Additionally, the method comprises forming a second crystalline semiconductor material in the second recess adjacent to the first crystalline semiconductor material by a second epitaxial growth process, wherein the second crystalline semiconductor material comprises dopant species of the first and second conductivity types.

A further illustrative method for forming drain and source regions of a transistor is provided. The method comprises performing a sequence of processes comprising an etch process and an epitaxial growth process for forming a recess in a semiconductor layer with a lateral offset to a gate electrode structure that is formed above the semiconductor layer and for filling a crystalline semiconductor material into the recess, wherein the crystalline semiconductor material comprises dopant species of a first and second conductivity type. The method additionally comprises repeating the sequence one or more times and increasing the lateral offset and increasing a depth of the recess for each repetition of the sequence.

One illustrative semiconductor device disclosed herein comprises a transistor including a gate electrode structure formed above a channel region. The transistor further includes drain and source regions formed laterally adjacent to the channel region, wherein the drain and source regions comprise a semiconductor alloy having a different lateral offset from the gate electrode structure at least at some different depth levels. The semiconductor alloy is designed to induce strain in the channel region.

BRIEF DESCRIPTION OF THE DRAWINGS

The disclosure may be understood by reference to the following description taken in conjunction with the accompanying drawings, in which like reference numerals identify like elements, and in which:

FIGS. 2e-2f schematically illustrate cross-sectional views of the transistor when repeating the sequence by using a spacer element for adjusting the lateral offset of a further cavity, according to illustrative embodiments;

Figure 1A:
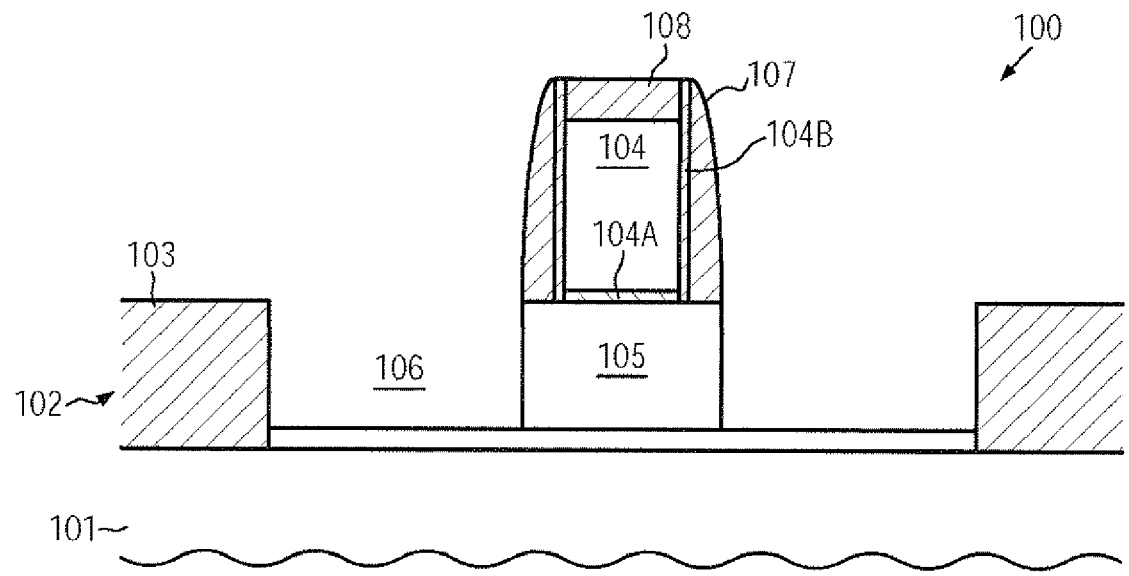
FIGS. 1a-1b schematically illustrate cross-sectional views of a transistor during various manufacturing stages in forming drain and source regions on the basis of an epitaxially grown semiconductor alloy with in situ doping and an implanted halo region, according to conventional strategies.
Figure 1B:
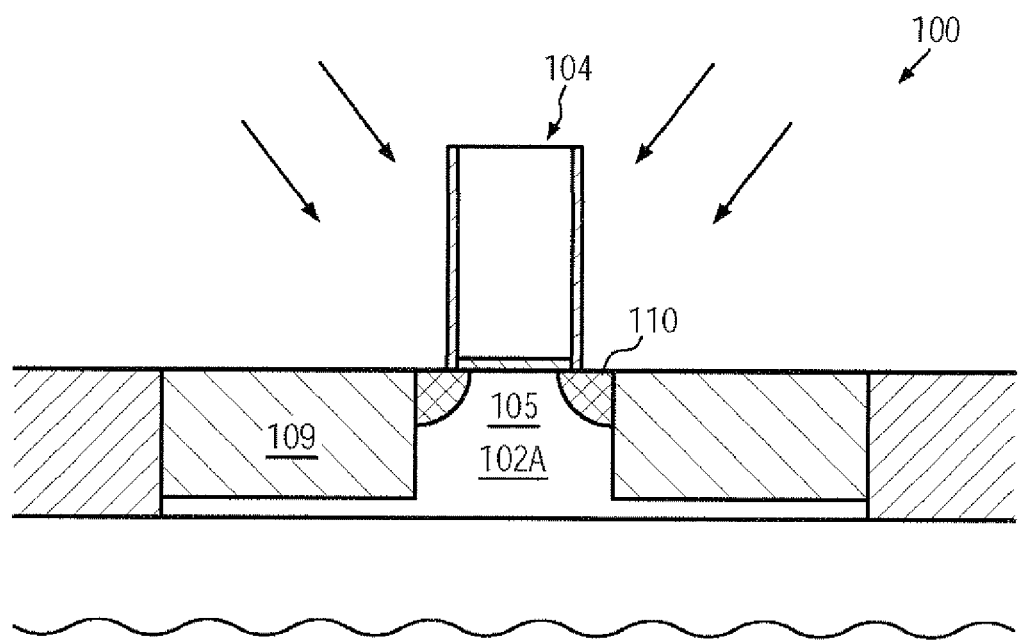
Figure 1C:
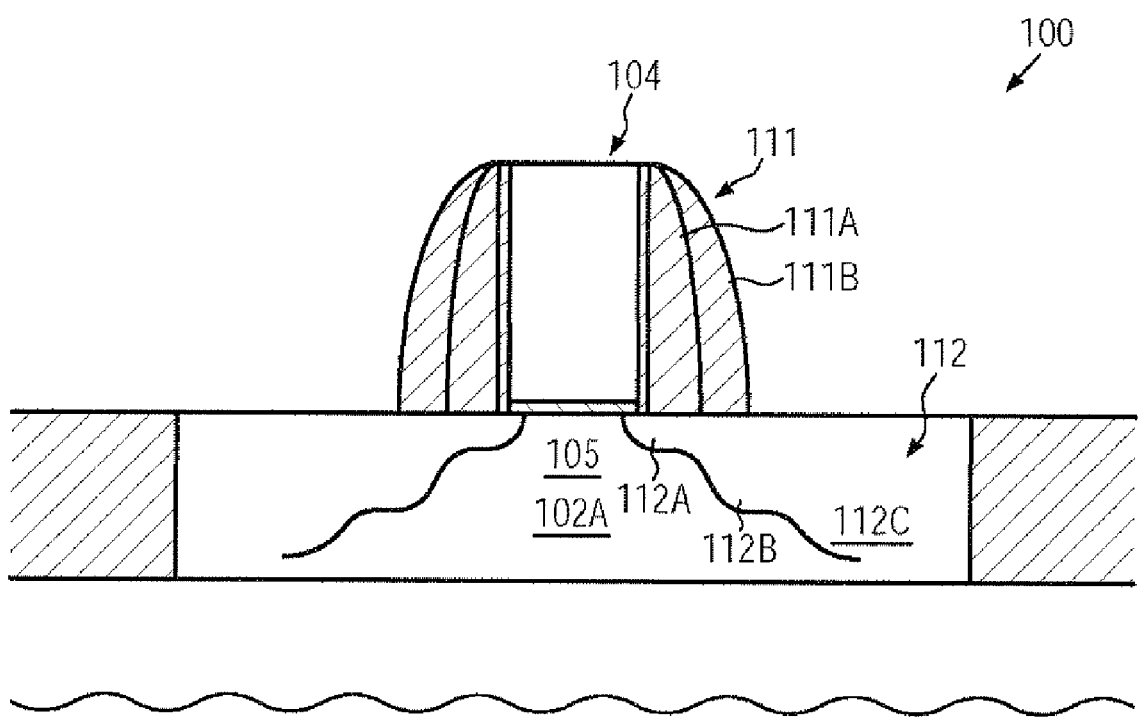
FIG. 1c schematically illustrates a transistor including drain and source regions formed by ion implantation on the basis of a complex sidewall spacer structure, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to semiconductor devices and methods in which drain and source regions of transistor elements may be formed by selective epitaxial growth techniques, wherein a plurality of epitaxial growth steps may be performed on the basis of different dopants species in combination with a different material composition and/or different lateral offsets to the gate electrode structure such that a desired lateral and vertical profiling may be accomplished. Furthermore, the epitaxially grown semiconductor material, which may also provide a desired high strain component in at least one type of transistor, may include dopant species of two different conductivity types so that the actual drain and source dopant species may be incorporated while concurrently providing the dopant species for respective counter-doped regions or halo regions. Thus, if desired, the complex drain and source dopant profiles may be established without requiring implantation processes, thereby significantly reducing any relaxation mechanisms which may typically be associated with conventional techniques in providing counter-doped or halo regions for enhancing channel controllability and reducing undesired dopant diffusion of the drain and source regions. Consequently, by introducing at least two different doping species during at least some of the individual epitaxial growth steps, the characteristics of the respective PN junctions at a specific depth level and at a specific lateral offset to the channel region may be efficiently adjusted, while at the same time the in situ doping provides the possibility of using significantly increased counter-doping concentration since the respective dopant species may be positioned with increased accuracy compared to conventional implantation techniques. For example, the counter-doped or halo regions in the vicinity of the channel region may be provided with high precision and moderately high concentration so as to appropriately counter short channel effects and reduce dopant diffusion, while, in subsequent epitaxial growth steps performed on the basis of an increased lateral offset, a reduced concentration of the counter-doping species may be provided, while the concentration of the drain and source dopant species may also be appropriately adjusted to obtain a low resistance path in the drain and source regions. The varying offset for positioning the semiconductor alloy may be accomplished on the basis of respective spacer elements, which may be used as an etch mask during the corresponding etch processes preceding the associated epitaxial growth step, wherein the combined width of the spacer elements provide the desired lateral offset, while the etch time may be controlled to obtain the desired depth level. The principles disclosed herein may also be advantageously applied to different transistor elements in order to obtain varying transistor characteristics, for instance with respect to threshold voltage and the like, which may be accomplished by masking one or more transistors during at least one sequence of etching a cavity and subsequently refilling the cavity with in situ doped semiconductor material. Thereafter, a respective sequence may be performed for the previously masked transistor, while now masking the other type of transistors so that different transistor characteristics may be finely tuned on the basis of the material characteristics of the semiconductor material to be filled in as well as on the basis of the corresponding in situ doping. For example, the very first sequence may be performed differently for different types of transistors, thereby enabling the adjustment of the transistor characteristics, for instance, by providing different "flavors" of transistors of basically the same conductivity type. Thereafter, further sequences of cavity etch and epitaxial growth may be performed commonly for the different transistor types in view of overall process efficiency. In other illustrative embodiments, the principles disclosed herein may be applied to transistors of different conductivity type wherein, for instance, a respective number of sequences of etch steps and epitaxial growth steps may be performed for one type of transistor while masking the other type of transistor and, after completing the basic transistor structure, the drain and source regions of the previously masked transistor may be formed by similar process techniques, thereby substantially completely avoiding any implantation processes for defining the drain and source regions of transistors of opposite conductivity type. In other cases, additional implantation processes may be used for adjusting the transistor characteristics for at least one type of transistor.

Consequently, the present disclosure provides the advantage of an efficient stress transfer, for instance on the basis of a silicon/germanium alloy, and using in situ doping in combination with advanced spacer techniques to obtain appropriately designed counter-doped or halo regions, thereby creating low resistance source and drain regions, while also reducing the effects of short channels, thereby enhancing overall transistor performance, since any disadvantages associated with conventionally applied implantation techniques in a highly scaled semiconductor device may be avoided or at least significantly reduced. In some approaches, the principles disclosed herein may be extended to an entire CMOS manufacturing flow in order to eliminate complex implantation-based source and drain doping techniques.

Figure 2A:
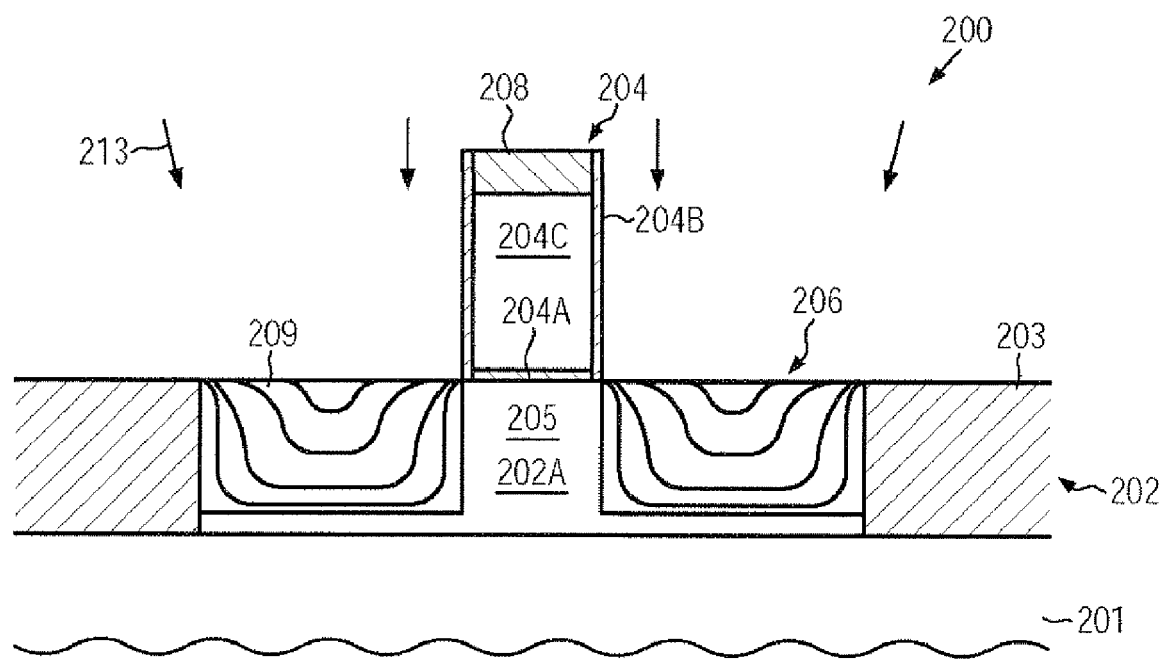
FIG. 2a schematically illustrates a cross-sectional view of a transistor device during a selective epitaxial growth process for filling cavities adjacent to a gate electrode structure with a semiconductor material according to a deposition behavior that may be used for efficiently incorporating two different dopant species during a single deposition step, according to illustrative embodiments.

FIG. 2a schematically illustrates a cross-sectional view of a semiconductor device 200, which may represent a transistor, such as a P-channel transistor, which may receive a semiconductor alloy in drain and source areas by a selective epitaxial growth technique. The device 200 may comprise a substrate 201 above which may be formed a semiconductor layer 202, such as a silicon-based layer, which may be understood as a material layer having incorporated therein a significant amount of silicon, possibly in combination with other materials, such as germanium, carbon, tin and the like. Furthermore, the device 200 may comprise a gate electrode structure 204 which may include a gate electrode material 204C in the form of any appropriate conductive material, such as polysilicon, metal-containing materials and the like. The gate electrode material 204C may be separated from a channel region 205 by a gate insulation layer 204A, which may represent any appropriate dielectric material, such as silicon-dioxide based materials, silicon nitride, high-k dielectric materials, which are to be understood as a material having a dielectric constant of approximately 10 or higher, or any combination of dielectric material. Furthermore, the gate electrode structure 204 may comprise a non-electrode material 204B at sidewalls thereof, which may be comprised of silicon nitride, silicon dioxide and the like. A cap layer 208 may cover the top surface of the gate electrode structure 204 and may be comprised of appropriate dielectric materials, which may efficiently suppress the deposition of semiconductor material during a selective epitaxial growth process 213. Moreover, cavities or recesses 206 may be formed in the semiconductor layer 202 adjacent to the gate electrode structure 204 wherein, depending on the overall process strategy for forming the cavities 206, an offset thereof from the gate electrode material 204C may be substantially determined by the width of the spacer 204B.

With respect to any manufacturing techniques and characteristics of the components described so far, the same criteria apply as previously explained with reference to the transistor 100. It should be appreciated that the cavities 206 may be formed so as to be completely embedded in semiconductor material, that is, at the side of the cavities 206 distant to the gate electrode structure 204, at least a portion of a semiconductor material may be provided, while in other cases, as for instance illustrated, the outer edges of the cavities 206 may be defined by isolation structures 203, for instance in the form of shallow trench isolations. During the selective epitaxial growth process, an appropriate semiconductor alloy, such as silicon/germanium, may be deposited with a desired fractions of germanium, for instance up to approximately 30 atomic percent or more, wherein typically the deposition conditions may result in a preferred growth on sidewalls of the cavities 206 on the basis of respective template material of the remaining semiconductor material 202A. On the other hand, the growth in the horizontal direction may be less pronounced, thereby obtaining a graded growth of the semiconductor alloy, indicated as 209, as is qualitatively illustrated in FIG. 2a. It should be appreciated that the growth pattern may represent a crystalline growth condition which may start from both sidewalls in a substantially symmetric manner, if a template material may also be provided at the outer edges of the cavities 206, as previously explained. In case the isolation structure may form the outer boundary of the cavities 206, the growth pattern may be shifted outwardly, thereby obtaining the substantially asymmetric pattern wherein, also in this case, a graded growth pattern may be obtained adjacent to the channel region 205 and the remaining semiconductor material 202A, which may also be referred to as the body region. The basic growth dynamics during the epitaxial growth process 213 may be advantageously used for obtaining a highly complex dopant profile for drain and source areas as well as halo regions or counter-doped regions, as will be explained with reference to the following figures.

Figure 2B:
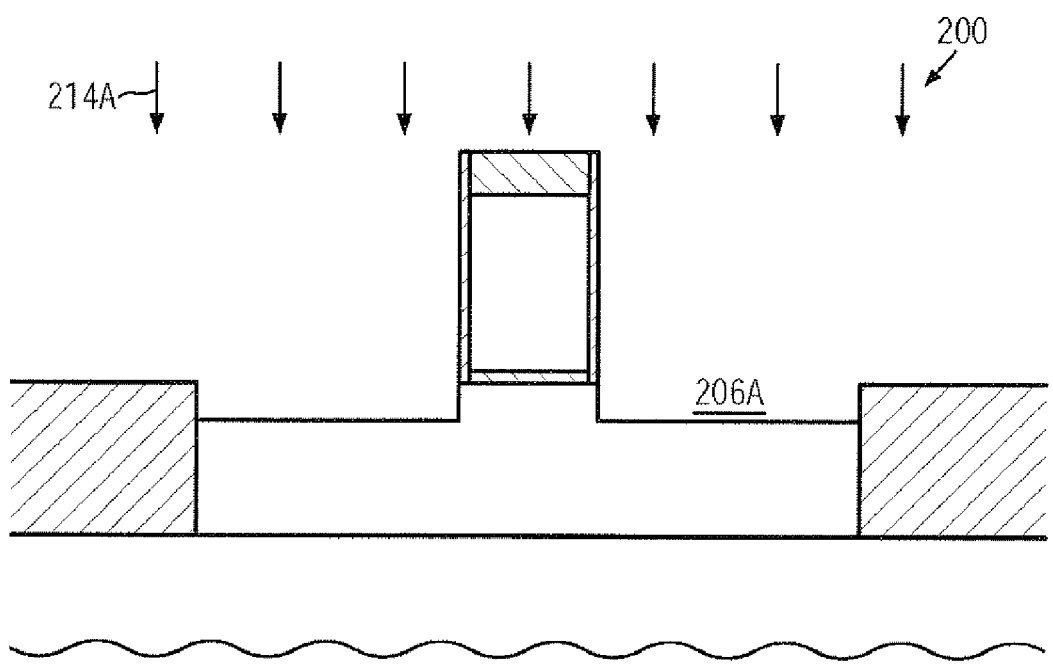
FIGS. 2b-2f schematically illustrate cross-sectional views of a transistor during a process sequence including an etch step for forming cavities and a subsequent selective epitaxial growth process for refilling the cavities with a semiconductor alloy including two different types of dopant species, according to illustrative embodiments.

FIG. 2b schematically illustrates the semiconductor device 200 according to illustrative embodiments in which the vertical and lateral dopant profile of the drain and source areas may be defined on the basis of in situ doping during a selective epitaxial growth process. In the manufacturing stage shown in FIG. 2b, the device 200 may be exposed to an etch ambient 214A, which may be designed to provide a substantially anisotropic etch behavior for selectively removing material of the semiconductor layer 202. For this purpose, well-established selective etch chemistries may be used in which silicon may be removed with respect to silicon nitride and/or silicon dioxide, thereby forming a recess 206A down to a specified depth that is less compared to conventional strategies as is, for instance, explained with reference to the device 100 in FIG. 1a. In the embodiment shown, the cap layer 208 and the spacer 204B may act as an etch mask for protecting the gate electrode material 204C, while the selectivity with respect to the isolation structure 203 may also be used to define the cavity 206A. In other cases, as previously explained, an additional etch mask may be defined to determine the lateral extension of the cavities 206A.

Figure 2C:
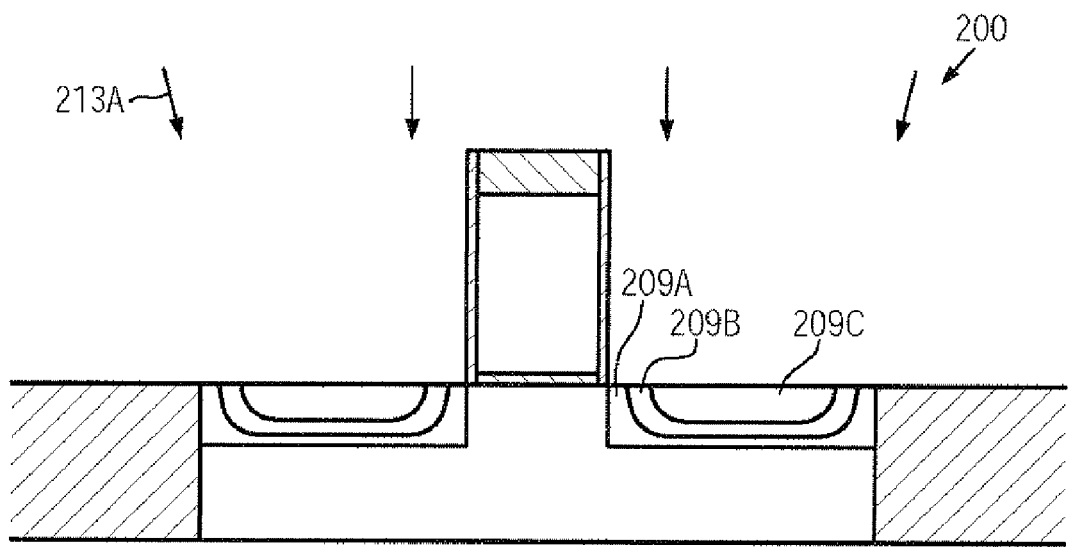

FIG. 2c schematically illustrates the semiconductor device 200 during an epitaxial growth process 213A which may, contrary to conventional epitaxial growth techniques, be performed on the basis of a deposition atmosphere, which may be changed during the process by introducing two different dopant species of opposite conductivity type. That is, generally, the deposition ambient of the process 213A may be established by using well-established process parameters, for instance with respect to the desired composition of the semiconductor alloy to be deposited, such as silicon/germanium, while, in an initial phase, a first dopant species may be incorporated with a desired concentration. The first dopant species may represent a dopant material having the same conductivity type as is induced by the dopant species representing the basic doping of the channel region 205 and the body region 202A. That is, the first dopant species may thus form a counter-doped region or halo region 209A, which may preferably be formed adjacent to the channel region 205, as may be required for appropriately adjusting the dopant gradient of respective PN junctions and also to efficiently reduce drain and source dopant diffusion, as previously explained. Thus, the first dopant species, such as arsenic, when the device 200 may represent a P-channel transistor, may be provided with high precision and uniformity within the region 209A, which may enable provision of higher counter-doping concentrations compared to conventional halo regions, which may typically be formed by ion implantation, wherein, as to the nature of the implantation process, the deposition of a comparable high concentration would result in unacceptable lattice damage, in combination with sophisticated implantation parameters with respect to dose and energy while nevertheless causing a less precise positioning of the dopant species. After having obtained a desired thickness of the region 209A, which may be adjusted on the basis of process time for a given and known deposition rate, the gas flow rate for the precursor containing the first dopant species may be appropriately reduced, while also the flow rate of a second dopant species, which may represent the actual drain and source dopant species, such as boron, for a P-channel transistor may increasingly be introduced into the deposition ambient. Consequently, a "graded" region 209B with a decreasing degree of counter-dope may be grown. It should be appreciated that the size and the dopant gradient in the region 209B with respect to the first dopant species and the second dopant species may be reliably adjusted on the basis of deposition parameters, which may be difficult to be achieved by implantation techniques. Consequently, the lateral dopant profile may be adjusted on the basis of gas flow rates during the deposition 213A and on the basis of the previously formed cavities 206A, thereby providing a high degree of overall process uniformity. At least in a final phase of the deposition process 213A, the supply of the first dopant species may be discontinued and a desired high concentration of the second dopant species may be introduced in order to form a highly doped region 209C, which may provide a low resistance area in the drain and source regions of the device 200. As previously indicated, depending on the growth conditions within the cavity 206A, a more-or-less symmetric deposition behavior with respect to the middle of the cavity 206A may be observed, which, however, may not negatively affect the overall desired low resistivity of the drain and source areas since an outer portion of the materials 209A, 209B, 209C may be removed in a subsequent manufacturing stage.

Figure 2D:
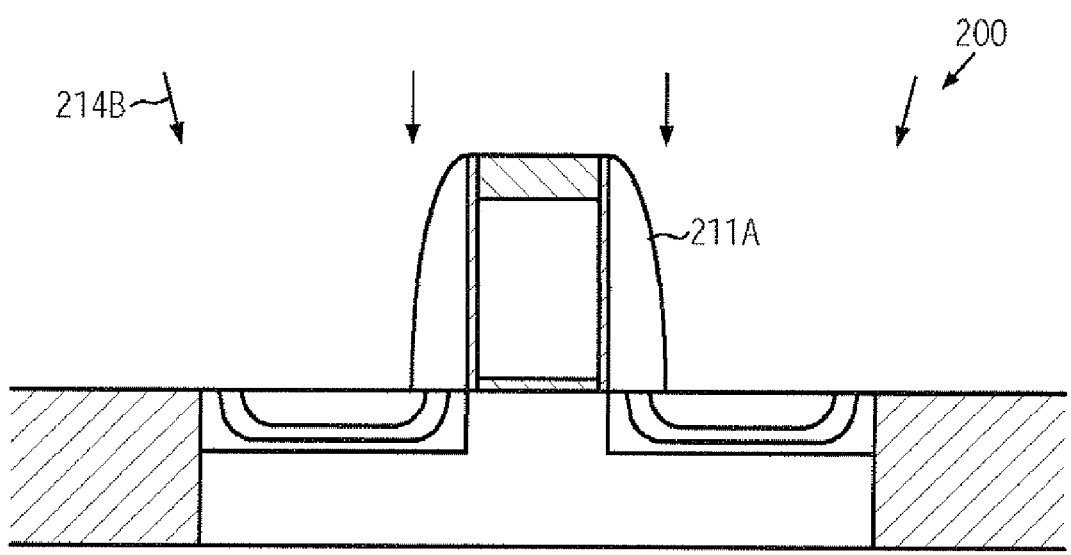

FIG. 2d schematically illustrates the semiconductor device 200 in a further advanced manufacturing stage in which a spacer element 211A may be formed on sidewalls of the gate electrode structure 204 so as to act as an etch mask that determines a desired lateral offset for a further anisotropic etch process 214B, which may be performed on the basis of well-established etch recipes to remove an exposed portion of the materials 209A, 209B, 209C and also etch into the semiconductor layer 202 up to a depth as desired for appropriately shaping the overall dopant profile of drain and source regions of the device 200. For example, the etch processes 214A, 214B may be performed on the basis of the same process recipe, however with different process times in order to obtain different depth levels.

Figure 2E:
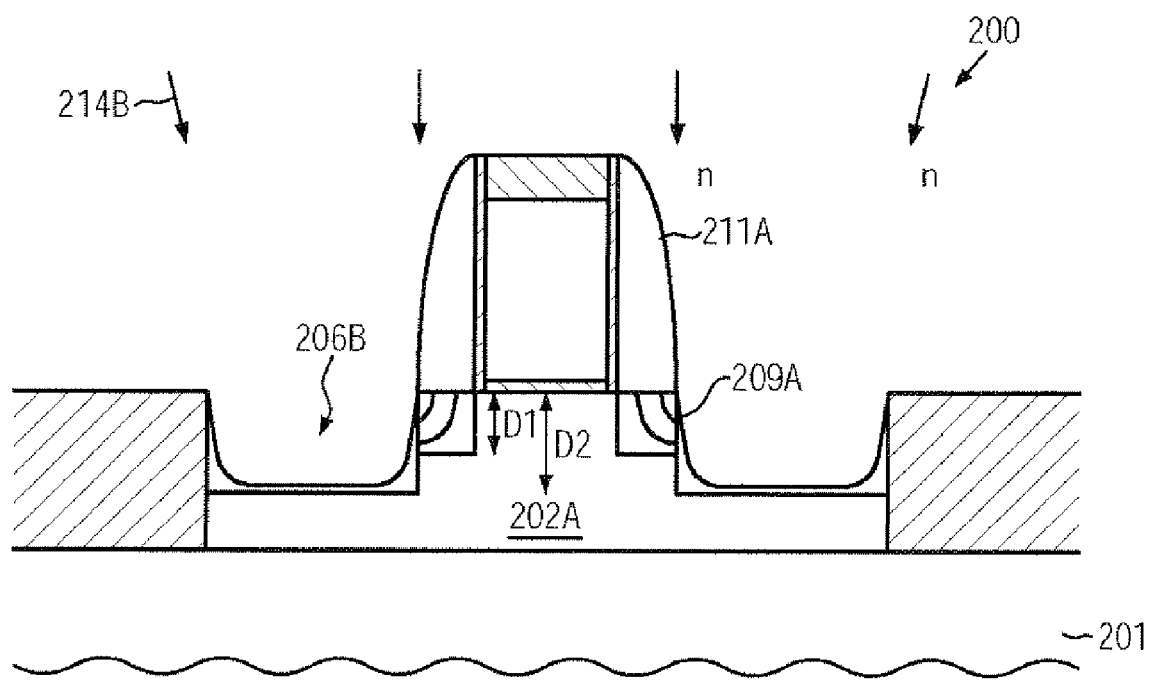

FIG. 2e schematically illustrates the device 200 during an initial phase of a further selective epitaxial growth process 214B, in which a dopant species of the first conductivity type, for instance an N-type dopant species, such as arsenic, may be incorporated into the deposition ambient to form the semiconductor alloy 209A, preferably at exposed sidewall portions of cavities 206B, which extends down to a second depth level D2, which is lower than the first depth level D1 of the first cavity 206A. During the formation of the region 209A, a desired high concentration of the first dopant species may be incorporated, as previously explained for the cavities 206A, wherein, however, in some illustrative embodiments, a reduced dopant concentration may be provided since the region 209A has a greater lateral offset to the channel region 205 defined by the spacer element 211A. Consequently, by appropriately selecting the width of the spacer 211A and the depth level D2, a desired concentration of the first dopant species may be positioned within the drain and source areas, wherein also the concentration may be reduced with an increase of lateral offsets and depth level.

Figure 2F:
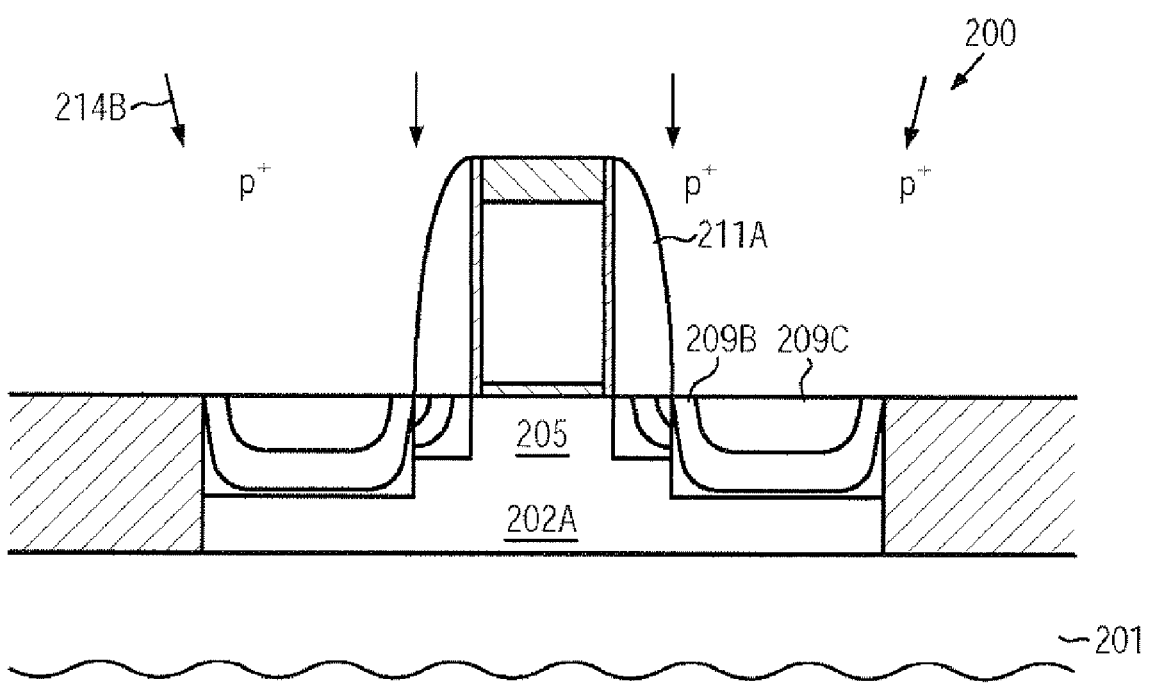

FIG. 2f schematically illustrates the device 200 during an advanced state of the selective epitaxial growth process 214B, in which a desired high concentration of the second dopant species, such as a P-type species, may be introduced into the deposition ambient to form the highly doped regions 209C. Depending on the desired overall dopant profile, also a graded region 209B may have been formed by appropriately controlling gas flow rates for precursor materials for the first and second dopant species, as is also previously explained with reference to FIG. 2e.

Figure 2G:
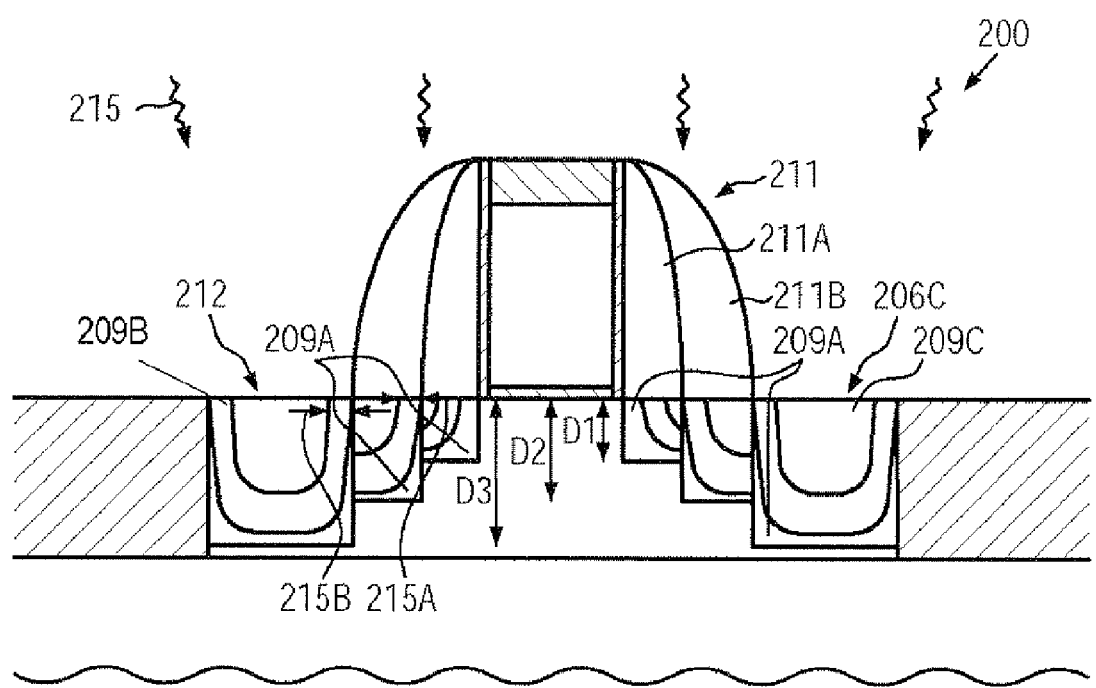
FIG. 2g schematically illustrates the transistor after a further repetition of the above-described sequence, according to still further illustrative embodiments.

FIG. 2g schematically illustrates the semiconductor device 200 in a further advanced manufacturing stage. As illustrated, a further spacer element 211B is formed on the spacer element 211A, thereby defining a spacer structure 211 that determines a lateral offset to the gate electrode structure 204 in accordance with a desired lateral profiling of the dopant concentration in drain and source areas 212. It should be appreciated that the spacer structure 211 may also comprise respective etch stop liners, if required, which are, for convenience, not shown in FIG. 2g. Furthermore, an in situ doped semiconductor alloy may also be formed in cavities 206C, which may extend down to a depth level D3 that is deeper than the level D2. For example, the semiconductor alloy in the cavities 206C may comprise a substantially counter-doped or halo region 209A, possibly in combination with a graded region 209B and a highly P-doped region 209C, as also previously explained with reference to the cavities 206A, 206B. It should be appreciated that also in the cavity 206C, appropriate dopant concentration may be established in each of the regions 209A, 209B and 209C. For example, in one illustrative embodiment, the dopant concentration of the first species, such as an N-type species, in the region 209A may be less compared to the concentration of the region 209A in the cavity 206B due to the increased lateral offset to the channel region 205. On the other hand, the concentration of the P-type dopant species, if a P-channel transistor is considered, in the region 209C may be higher compared to the material 209C in the cavity 206B in order to provide a low overall resistance of the drain and source regions 212.

The semiconductor device 200 as shown in FIG. 2g may be formed on the basis of the following processes. After the completion of the epitaxial growth process 214B (FIG. 2f), the spacer element 211B may be formed by depositing an appropriate spacer material, possibly in combination with an etch stop material, and the material layer may be patterned by anisotropic etch techniques, as is well established in the art. The resulting spacer 211 may have a desired width, as determined by the initial layer thickness and the etch conditions, in order to provide the desired lateral offset of a further sequence of an etch process, such as the processes 214A, 214B, and a selective epitaxial growth process, such as the processes 213A, 213B. In the corresponding etch process, similar or the same process parameters may be used wherein, however, an etch time may be adjusted such that the desired depth level D3 is obtained. Similarly, during the subsequent selective epitaxial growth process, the basic process parameters may be used as in the previous processes 213A, 213B, while the incorporation of the P-type and N-type dopant species may be adjusted on the basis of the desired overall dopant concentrations in the regions 209A, 209B, 209C in the cavity 206C. Consequently, a substantially stair-like dopant profile may be created in the drain and source regions 212. Thereafter, an anneal process 215 may be performed in order to provide a certain degree of dopant diffusion so as to adjust the final shape of the drain and source regions 212, while also adjusting the resulting dopant gradients and providing a substantially continuous conductive path between the highly doped regions 209C in each of the cavities 206A, 206B and 206C. For example, the counter-doping region 209A in upper areas of the respective cavities 206A, 206B, 206C, which may represent areas of high resistance in the drain and source regions 212, may be "removed" since dopant diffusion of dopant species of the opposite conductivity type, in this example of the P-type, may occur from both lateral sides, as indicated by the arrows 215A, 215B. In this manner, a substantially continuous low resistance path may be established in the drain and source regions 212. On the other hand, at the stair-like boundaries of the cavities 206A, 206B, 206C, the moderately highly doped halo regions 209A may be substantially maintained since these regions are bordered by the graded regions 209B and the channel region and the body region 202A, respectively. It should be appreciated that the anneal process 215 may comprise any appropriate anneal technique, such as laser-based anneal processes, flashlight-based anneal processes and the like, in which the degree of dopant diffusion may be adjusted to obtain the desired overall lateral and vertical dopant profile in the drain and source regions 212. Since the regions 209A, 209B, 209C are in a substantially crystalline state, the re-crystallization of drain and source areas may not have to be taken into consideration, contrary to conventional approaches, which are based on implantation techniques, at least for the creation of the halo regions.

Figure 2H:
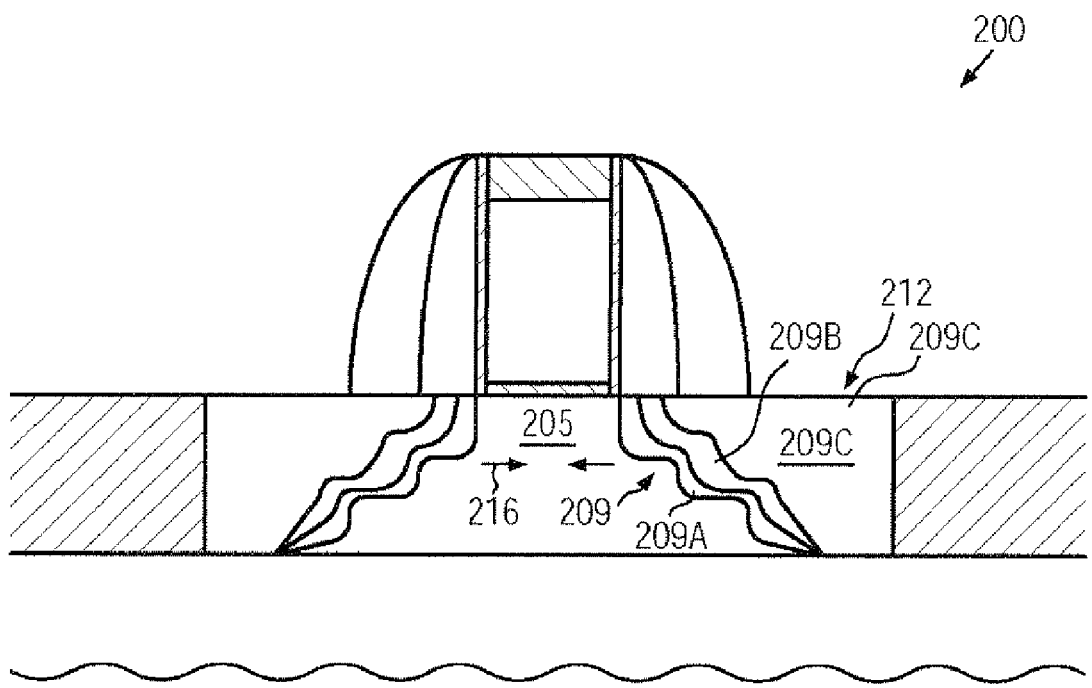
FIGS. 2h-2i schematically illustrate cross-sectional views of transistor devices formed in accordance with the above-described process sequence, which is repeated several times to obtain a desired lateral and vertical dopant profile on the basis of in situ doping of a semiconductor alloy, according to still further illustrative embodiments.

FIG. 2h schematically illustrates the device 200 after the anneal process 215 with a semiconductor alloy 209, in which the drain and source regions 212 are formed in accordance with a desired lateral and vertical dopant profile, wherein the highly counter-doped region 209 may have a substantially stair-like configuration, wherein, as previously explained, in some illustrative embodiments, the degree of counter-doping may decrease with an increase of lateral offset and depth level of the corresponding individual "steps" as initially provided by the cavities 206A, 206B and 206C, as previously explained. The graded region 209B of the semiconductor alloy 209 may represent an area in which the respective PN junctions may be located, wherein the dopant gradient thereof, as well as the size and location, may be defined by the previously performed sequences of etch processes and selective epitaxial growth processes, such as the sequences 213A, 214B and 213B and 214B, in combination with the anneal process 215, while the counter-doped region 209A may provide enhanced stability with respect to diffusion of the dopant species, such as boron. Furthermore, the highly doped regions 209C may provide the low resistance path in the drain and source regions 212, wherein it should also be appreciated that the lateral dopant concentration may vary in accordance with device requirements due to the various preceding selective epitaxial growth processes. Furthermore, due to the implantation-free process flow for forming the drain and source regions 212, the degree of crystal defect may be significantly reduced compared to conventional approaches based on halo implantation sequences so that strain relaxation in the semiconductor alloy 209 may be significantly reduced, thereby providing an increased strain component 216 in the channel region 205. Thus, by using advanced spacer techniques for forming the sidewall spacer structure 211 in combination with a sequence of etch processes and selective epitaxial growth techniques, sophisticated dopant profiles in the drain and source regions may be accomplished by in situ doping, wherein the lateral and vertical profiling of the dopant concentration may be adjusted on the basis of the number of sequences of an etch process, in combination with a selective epitaxial growth process, and the process parameters of the in situ deposition of the dopant species during each individual sequence.

Figure 2I:
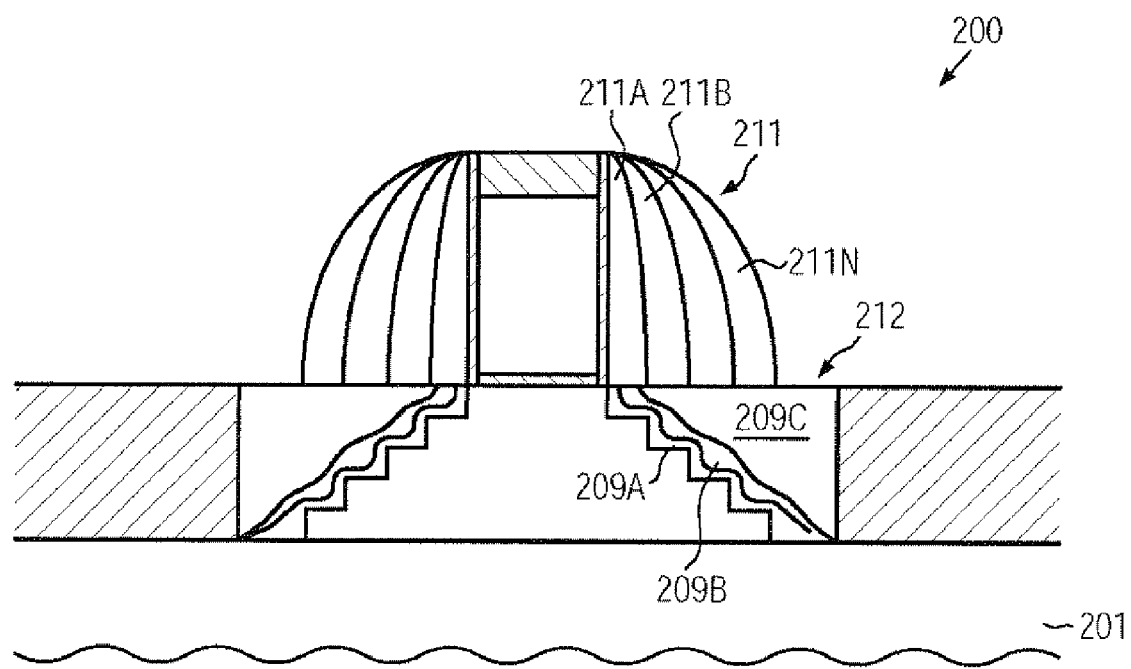

FIG. 2i schematically illustrates the device 200 in accordance with further illustrative embodiments in which the configuration of the drain and source regions 212 may be accomplished on the basis of a plurality of sequences including an etch process, such as the processes 213A, 213B, and an associated selective epitaxial growth process, such as the processes 214A, 214B. As illustrated, the spacer structure 211 may include a plurality of spacer elements 211A, 211B, 211N, each of which may act as an etch and growth mask during a corresponding sequence of an etch process and an epitaxial growth process, as previously explained. Thus, with increasing lateral offset from the channel region 205 or the gate electrode structure 204, the corresponding depth level of the respective cavity may be increased and for each selective epitaxial growth process an appropriate in situ doping may be used, for instance a reduction of the dopant concentration with increasing lateral offset and depth in the counter-doped region 209A, as previously explained, while also a respective adaptation of the graded region 209B, i.e., the region in which PN junctions may be established, and dopant concentration in the low resistance region 209C may be adapted. Consequently, by providing a plurality of repetitions of the process sequence described above, a finely tuned overall lateral and vertical dopant profile for the drain and source regions 212 and the counter-doped or halo region 209A may be provided.

With reference to FIGS. 3a-3f, further illustrative embodiments will now be described, in which the process flow for forming drain and source regions by in situ doping may at least be partially decoupled for different transistors.

Figure 3A:
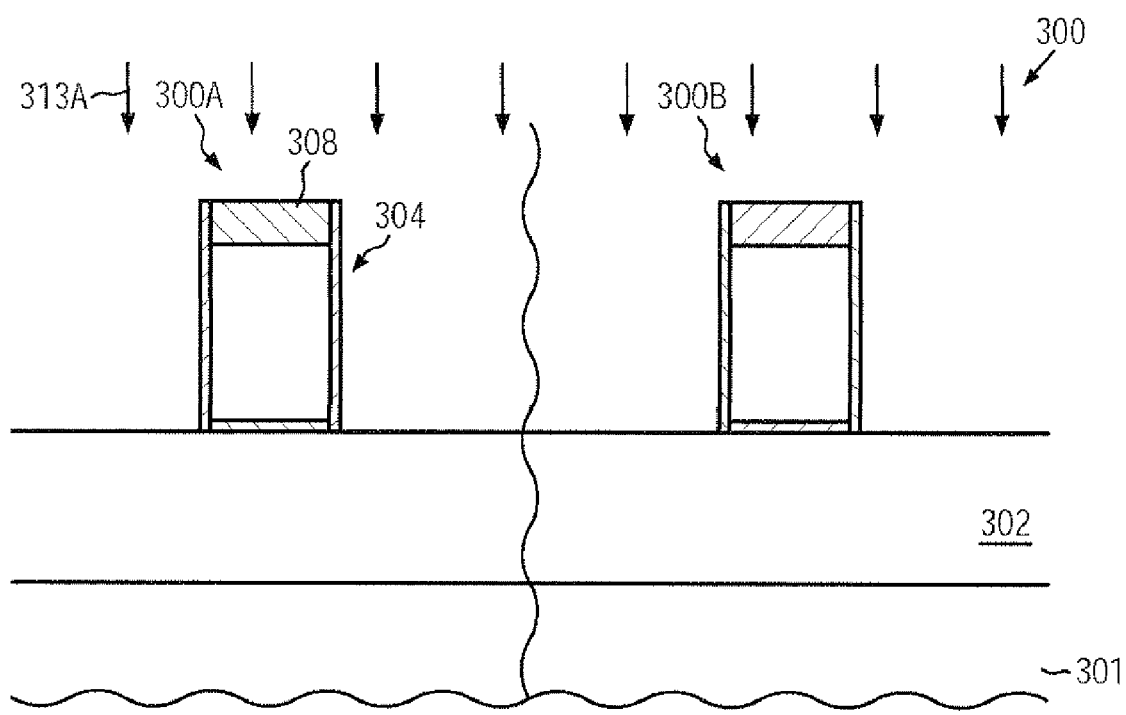
FIGS. 3a-3e schematically illustrate cross-sectional views of the semiconductor device including two different transistors during various manufacturing stages in which at least one sequence for forming a cavity and refilling the same with in situ doped semiconductor material may be performed differently for both transistor devices, according to illustrative embodiments.

FIG. 3a schematically illustrates a semiconductor device 300 comprising a substrate 301, above which may be provided a semiconductor layer 302. For example, the substrate 301 and the semiconductor layer 302 may represent an SOI configuration when a buried insulating layer (not shown) may be positioned between the substrate 301 and the semiconductor layer 302. In other cases, a bulk configuration may be provided, i.e., the semiconductor layer 302 may represent an upper portion of the substrate 301 that may be provided in the form of a crystalline semiconductor material. Furthermore, the device 300 may comprise a first transistor 300A and a second transistor 300B comprising, in the manufacturing stage shown, a gate electrode structure 304 including a cap layer 308. With respect to the gate electrode structure 304, the same criteria apply as previously explained. Furthermore, the device 300 may be exposed to a cavity etch process 313A, which may be performed on the basis of process parameters so as to obtain a desired selectivity in order to selectively remove material of the layer 302 adjacent to the gate electrode structures 304. As previously explained with reference to the etch processes 213A, 213B, respective process parameters may be adjusted such that a desired depth level may be obtained when recessed in the semiconductor layer 302.

Figure 3B:
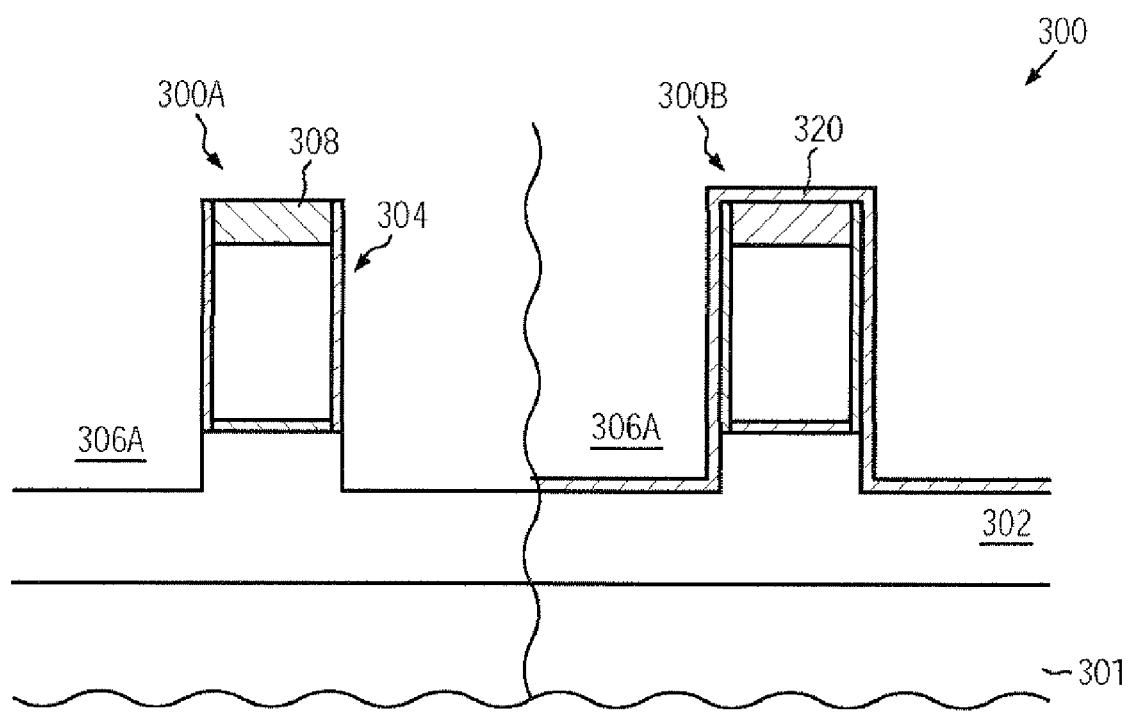

FIG. 3b schematically illustrates the device 300 after the etch process 313A, thereby obtaining recesses or cavities 306A having a desired depth. Furthermore, the second transistor 300B may be covered by a mask layer 320, which may be comprised of any appropriate dielectric material, such as silicon dioxide, silicon nitride, silicon oxynitride and the like, which may act as an efficient growth mask during a subsequent selective epitaxial growth process. The mask layer 320 may be formed by depositing a dielectric material in accordance with well-established process recipes using chemical vapor deposition (CVD) and the like. Thereafter, the dielectric layer 320 may be removed from above the first transistor 300A by providing a lithography mask and selectively etching the layer 320 with respect to the underlying material, at least the material of the layer 302.

Figure 3C:
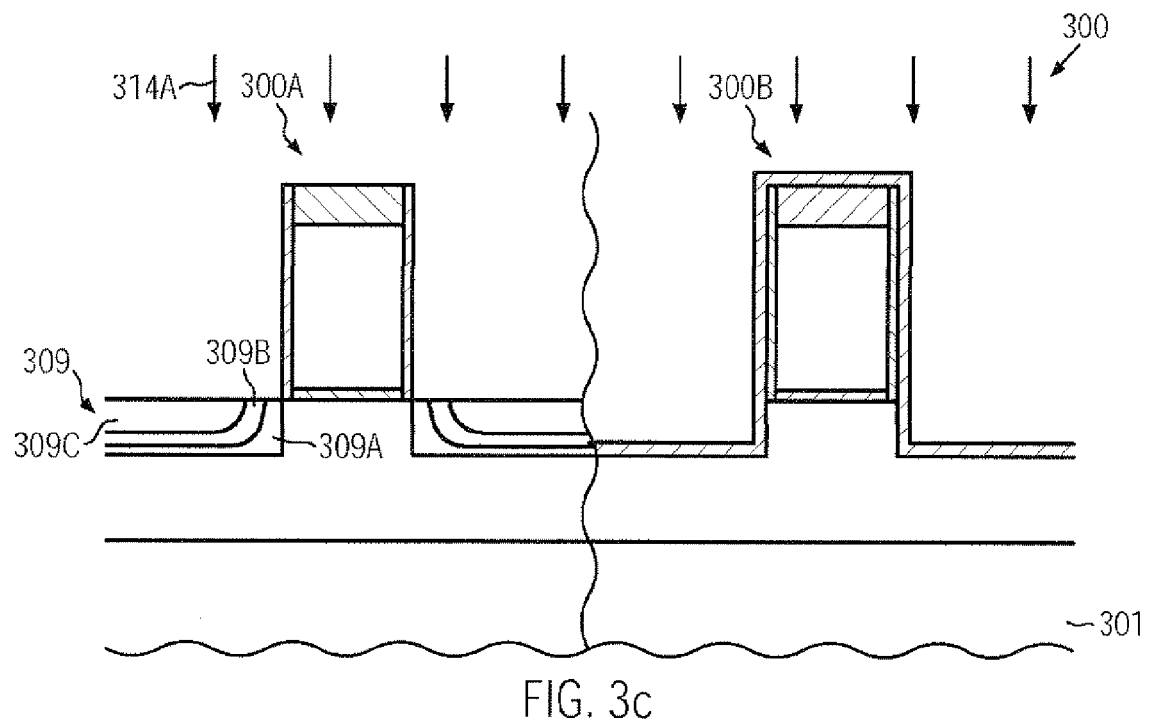

FIG. 3c schematically illustrates the semiconductor device 300 during a selective epitaxial growth process 314A, in which a semiconductor alloy, such as silicon/germanium, silicon/carbon and the like, may be deposited in accordance with process recipes, as previously explained with reference to the device 200. That is, during the growth process 314A, at least two dopant species of opposite conductivity type may be provided such that a halo region or counter-doped region 309A, a graded region 309B and a highly doped region 309C may be obtained within the strained semiconductor alloy 309, as is also previously explained. During the process 314A, the parameters for controlling the material composition of the semiconductor alloy 309, as well as the parameters for controlling the dopant profile, may be selected such that a desired performance of the transistor 300A may be accomplished. On the other hand, the mask layer 320 may substantially avoid any material deposition above the second transistor 300B.

Figure 3D:
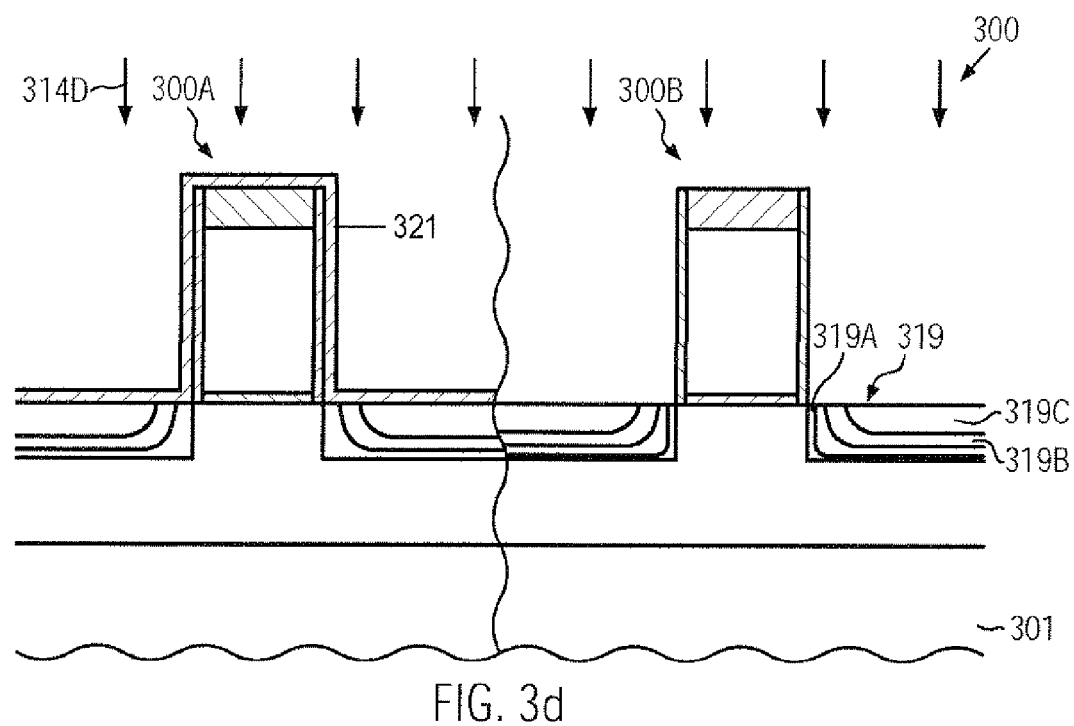

FIG. 3d schematically illustrates the semiconductor device 300 in an advanced manufacturing stage in which a mask layer 321 is selectively formed above the first transistor 300A, while the second transistor 300B may be exposed to an etch ambient 314D to fill the cavities 306A with an appropriate semiconductor material. The etch mask 321 may be comprised of any appropriate dielectric material, as is also explained with reference to the layer 320. The layer 321 may be formed, for instance, by depositing an appropriate dielectric material and providing an etch mask, such as a resist mask, to cover the first transistor 300A and expose the second transistor 300B. In a subsequent etch process, the exposed portion of the layer 321, possibly in combination with the layer 320, may be removed on the basis of a selective etch recipe. In other cases, the layer 320 may be selectively removed without providing an etch mask and subsequently material of the layer 321 may be deposited and may be patterned by lithography and etch techniques. After preparing the surface of the second transistor 300B for the selective epitaxial growth process 314D, an appropriate dopant concentration may be established in an initial phase of the process 314D to obtain the desired degree of counter-doping, as previously described. It should be appreciated that, depending on the characteristics of the transistor 300B, the material composition of a semiconductor material 319 formed in the cavities 306A may be selected differently with respect to the transistor 300A, that is, if a certain type of strain may not be required in the transistor 300B or if a significantly reduced type of strain may be desired, the semiconductor material 319 may be provided in the form of substantially the same material as is present in the semiconductor layer 302, while, in the latter case, a reduced fraction of the strain-inducing component may be incorporated. For example if both transistors 300A, 300B may require a compressive strain, however with a different magnitude, the fraction of germanium, tin and the like, which may contribute to an increased natural lattice constant compared to a silicon-based material of the layer 302, may be selected differently. In other cases, a different type of strain may be created, as will be described later on with reference to FIG. 3f. Consequently, the material 319 may have incorporated therein areas 319A, 319B and 319C, which may correspond to a counter-doped region, a graded region and a highly doped region, as previously explained, wherein, however, the concentrations, as well as deposition, may differ from the corresponding dopant profile in the first transistor 300A. In this manner, transistor characteristics, such as threshold voltage, drive current and the like, may be varied within a wide range on the basis of in situ doping. Furthermore, the strain level may also be varied, if desired.

Figure 3E:
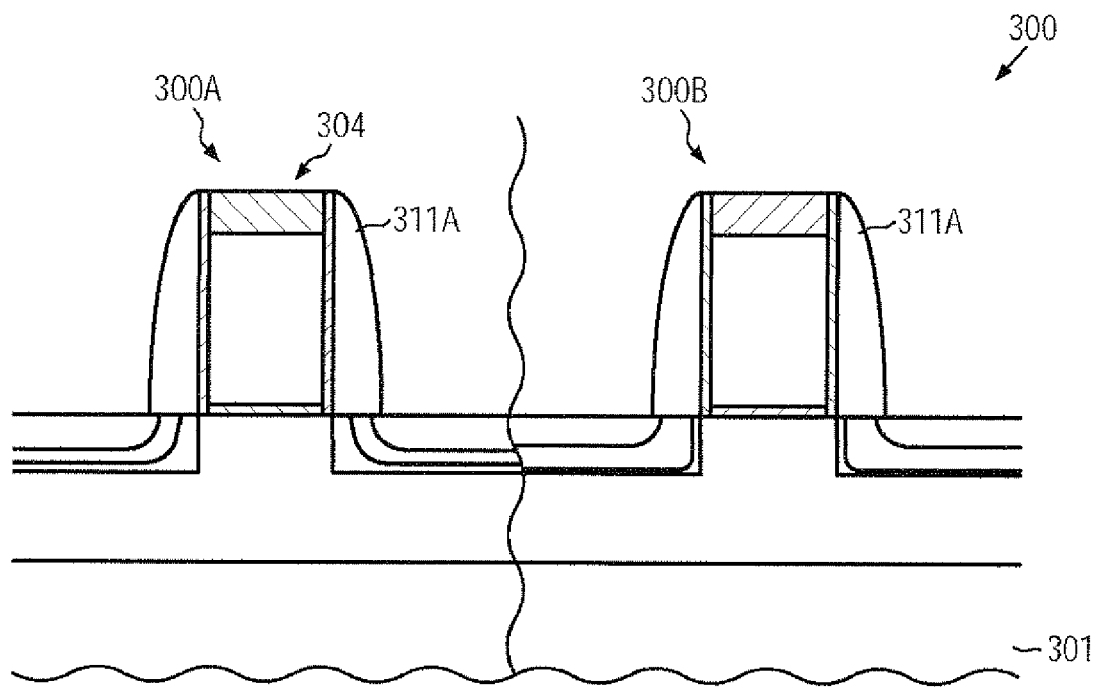

FIG. 3e schematically illustrates the semiconductor device 300 in an advanced manufacturing stage in which a spacer element 311A may be formed on sidewalls of the gate electrode structures 304. Thereafter a further sequence, including an etch process and a selective epitaxial growth process, may be performed to provide the respective cavities and filling the same with an in situ doped semiconductor material, as previously described. In the embodiment shown, the further processing may be based on a common process such that the drain and source areas of the first and second transistors 300A, 300B at a depth level below the cavities 306A may be very similar or identical, while nevertheless critical transistor characteristics, such as threshold voltage, may have been appropriately adjusted on the basis of the epitaxial growth processes 314A, 314D. Hence, a plurality of different transistor characteristics may be obtained on the basis of a process sequence, as previously described with reference to the device 200, while a difference in the first epitaxial growth processes 314A, 314D may provide the desired variation of transistor characteristics. Hence, the transistors 300A, 300B may be manufactured on the basis of in situ doping in accordance with a process sequence previously described, wherein a difference in transistor characteristics may be efficiently adjusted on the basis of well-established lithography techniques by alternating masking of the transistors during at least one epitaxial growth process. It should be appreciated that, if more complex dopant profiles may be required, a respective masking regime may be applied during several epitaxial growth processes.

Figure 3F:
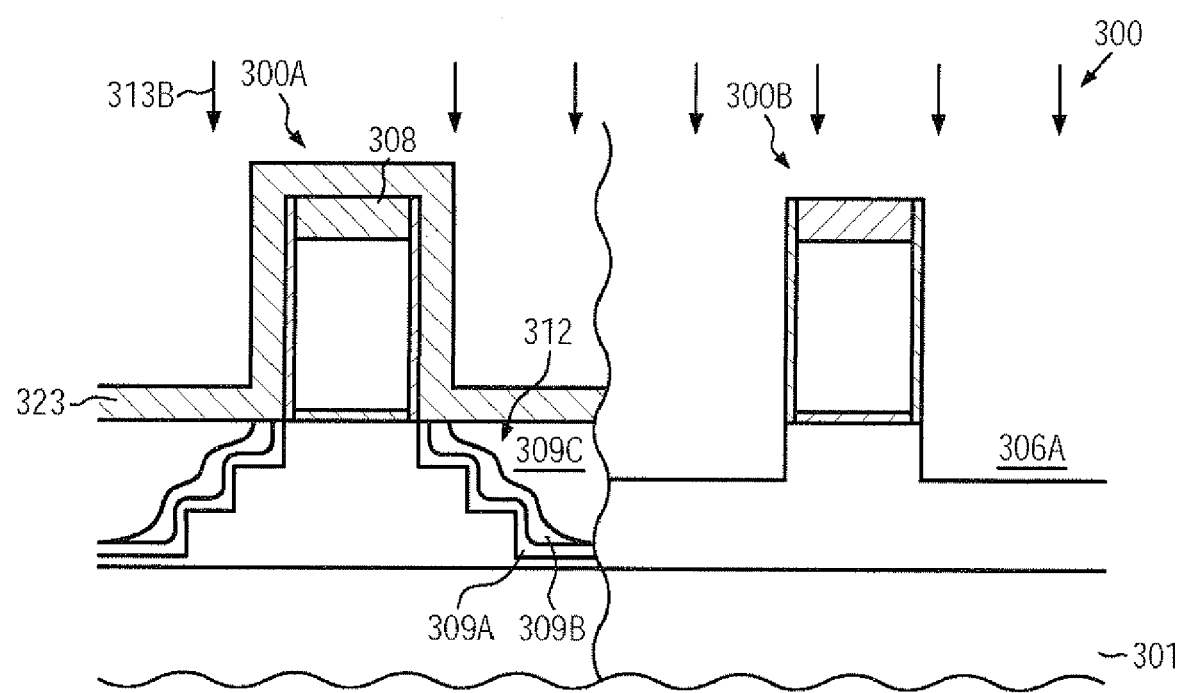
FIG. 3f schematically illustrates the semiconductor device with transistors of different conductivity type wherein an in situ doped sophisticated dopant profile may be established separately for both transistors, according to yet other illustrative embodiments.

With reference to FIG. 3f, still further illustrative embodiments will be described in which different transistor characteristics may be established by first performing a plurality of process sequences, each sequence including an etch process followed by a selective epitaxial growth process, as previously discussed, so as to complete the basic transistor configuration while masking one or more other transistor types. Thereafter, the previously completed transistor may be masked and a corresponding process flow including a plurality of sequences of etch processes and selective epitaxial growth processes may be applied to the one or more other types of transistors. This masking regime may also be applied to a plurality of different transistor types, if required.

FIG. 3f schematically illustrates the device 300 in an advanced manufacturing stage. That is, the first transistor 300A may comprise drain and source regions 312 in which the semiconductor alloy 309 may be provided with the desired dopant profile. That is, a stair-like configuration of the material 309 may be provided, as previously explained, wherein the number of individual steps and thus lateral offset levels and step levels may be selected in accordance with the requirements of the transistor 300A. Thus, a counter-doped region 309A, followed by a graded region 309B and a highly doped region 309C may be provided in the drain and source regions 312. Furthermore, the transistor 300A may be covered by a mask layer 323, which may be comprised of any appropriate material or material composition so as to act as etch mask and growth mask during the further processing. On the other hand, the second transistor 300B may be exposed to an etch ambient 313B so as to form respective cavities 306A, the depth of which may be selected in accordance with requirements for the transistor 300B. For example, the transistor 300A may represent a P-channel transistor, in which compressive strain may be desired, which may be accomplished by providing a silicon/germanium material, a silicon/germanium/tin material and the like. On the other hand, the transistor 300B may represent an N-channel transistor, in which a substantially strain-neutral configuration may be desired or in which a tensile strain may be created. Thus, during a subsequent selective epitaxial growth process, an appropriate material composition, such as a silicon material if the layer 302, is substantially comprised of silicon, or a silicon/carbon alloy, may be formed if a tensile strain is desired. Furthermore, the incorporation of a first and second dopant species may be selected such that an appropriately doped halo region may be obtained followed by a graded region and a highly doped region, as previously explained for the material 309. Thereafter, a further sequence of an etch process and a selective epitaxial growth process may be performed while still covering the first transistor 300A. Hence, depending on the overall complexity of the drain and source regions of the second transistor 300B, a plurality of respective process sequences may be performed, thereby establishing the required strain conditions and dopant profile for the transistor 300B without requiring additional implantation processes. Finally, the device 300 may be annealed in order to adjust the final dopant profile, as is also previously explained. It should be appreciated that the transistor 300A may have been previously annealed, depending on the overall process strategy. Consequently, during a further anneal process for the second transistor 300B, parameters may be selected such that, in combination with the desired overall diffused dopant profile in the transistor 300A, the desired final profile may be obtained.

Figure 4A:
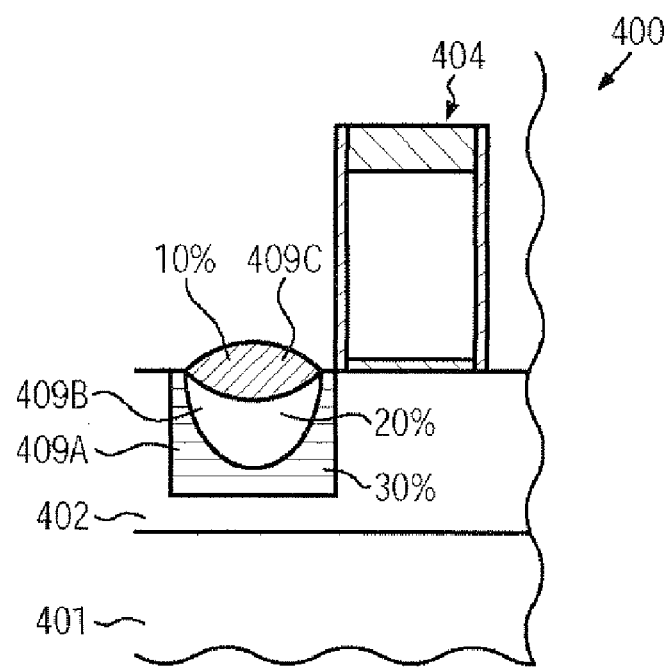
FIGS. 4a-4b schematically illustrate cross-sectional views of a transistor including graded layers of silicon/germanium (SiGe) (FIG. 4a) and with one or more dopant species added to the graded SiGe layers (FIG. 4b), according to still further illustrative embodiments.
Figure 4B:
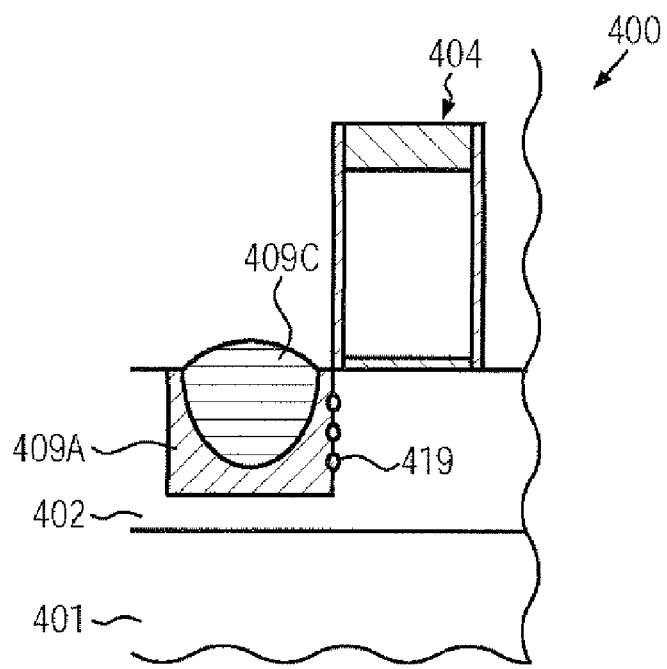

With reference to FIGS. 4a-4b, further embodiments will now be described, in which control of short channel effects may be accomplished by a graded semiconductor alloy with a specifically adapted dopant distribution, while also addressing increased susceptibility to attack of semiconductor alloys, such as silicon/germanium, during processing, such as cleaning and resist stripping, when increased levels of germanium are used in view of strain enhancement.

FIG. 4a schematically illustrates a portion of a transistor 400 comprising a substrate 401 and a silicon-based semiconductor layer 402. A gate electrode 404 is formed above the semiconductor layer 402, adjacent to which a graded semiconductor alloy 409, for instance a silicon/germanium material, is formed in drain or source areas. The alloy 409 may comprise a first layer 409A with a high germanium concentration, such as approximately 30 atomic % or more, a second layer 409B with a lower concentration, such as approximately 20 atomic % and a third layer 409C with a further reduced germanium concentration of approximately 10 atomic % or less. As previously discussed, other values for the germanium concentration and for the number of layers may be used, depending on the device requirements. This configuration of the transistor 400 provides a strain-inducing germanium layer, i.e., the layer 409A, that is protected from process attack by a layer of silicon/germanium having a lower germanium concentration, which is less susceptible to erosion during the overall manufacturing process.

FIG. 4b illustrates the transistor 400 according to embodiments in which the graded semiconductor alloy 409 may be provided with an appropriate in situ doped dopant concentration. As shown, dopant species 419 used for controlling short channel effects may be provided in the layer 409A having the high germanium concentration, such as halo dopants, as is also explained above, while the layer 409C may be substantially non-doped or weakly doped with halo dopants. Due to the in situ doping, any stress relaxation due to ion implantation may be avoided. Furthermore, in some embodiments, other dopants 419 may be incorporated into the layers 409 to stop, for instance, the diffusion of boron by the addition of carbon or nitrogen. Thus, the dopant concentration and the type of dopants 419 may be controlled individually for each of the layers 409, while also the germanium concentration thereof may be adjusted so as to obtain a graded configuration.

As a result, the present disclosure provides techniques and semiconductor devices in which highly complex dopant profiles may be provided by in situ doping, possibly in combination with the formation of a highly strained semiconductor material in the drain and source areas, wherein the corresponding strain component in the channel region may be maintained due to a significant reduction of crystalline defects, which, in conventional approaches for forming halo regions, may be introduced during the ion implantation processes. Furthermore, by using advanced spacer techniques, the vertical and lateral profiling of the dopant concentration may be enhanced, since the dopant species may be positioned with high precision and uniformity compared to implantation-based technologies. Thus, drain and source regions of sophisticated dopant profiles may be established without requiring implantation processes, at least for one type of transistor, while, in other cases, a manufacturing flow may be provided in which implantation of drain and source regions may be avoided or significantly reduced, thereby providing the potential for further scaling transistor devices due to the enhanced precision of positions of the dopant species.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first crystalline semiconductor material in a first recess located in an active region of a transistor laterally adjacent to a gate electrode structure by performing a first epitaxial growth process, said first crystalline semiconductor material comprising a dopant species of a first conductivity type and a dopant species of a second conductivity type that is opposite to said first conductivity type;
forming a second recess laterally offset from said gate electrode structure, said second recess extending through said first crystalline semiconductor material;
forming a second crystalline semiconductor material in said second recess adjacent to said first crystalline semiconductor material by performing a second epitaxial growth process, said second crystalline semiconductor material comprising dopant species of said first and second conductivity types;
forming a third recess laterally offset from said gate electrode structure, said third recess extending through a portion of said second crystalline semiconductor material; and
forming a third crystalline semiconductor material in said third recess adjacent to said second crystalline semiconductor material by a performing third epitaxial growth process, wherein said third crystalline semiconductor material comprises dopant species of said first and second conductivity types.

2. The method of claim 1, wherein said third recess is formed to a deeper depth than said second recess.

3. A method, comprising:
forming a first crystalline semiconductor material in a first recess located in an active region of a transistor laterally adjacent to a gate electrode structure by performing a first epitaxial growth process, said first crystalline semiconductor material comprising a dopant species of a first conductivity type and a dopant species of a second conductivity type that is opposite to said first conductivity type;
forming a second recess laterally offset from said gate electrode structure, said second recess extending through said first crystalline semiconductor material;
forming a second crystalline semiconductor material in said second recess adjacent to said first crystalline semiconductor material by performing a second epitaxial growth process, said second crystalline semiconductor material comprising dopant species of said first and second conductivity types; and
covering a second transistor while performing said first epitaxial growth process, exposing said second transistor after performing said first epitaxial growth process and performing said second epitaxial growth process commonly in said transistor and said second transistor.

4. A method, comprising:
forming a first crystalline semiconductor material in a first recess located in an active region of a transistor laterally adjacent to a gate electrode structure by performing a first epitaxial growth process, said first crystalline semiconductor material comprising a dopant species of a first conductivity type and a dopant species of a second conductivity type that is opposite to said first conductivity type;
forming a second recess laterally offset from said gate electrode structure, said second recess extending through said first crystalline semiconductor material;
forming a second crystalline semiconductor material in said second recess adjacent to said first crystalline semiconductor material by performing a second epitaxial growth process, said second crystalline semiconductor material comprising dopant species of said first and second conductivity types; and
covering a second transistor while performing said first and second epitaxial growth processes, exposing said second transistor after performing said first and second epitaxial growth processes, and performing a sequence of etch processes and epitaxial growth processes while masking said transistor so as to form drain and source regions in said second transistor.

5. The method of claim 4, wherein said transistor and said second transistor are transistors of opposite conductivity type.

* * * * *